(12) United States Patent
Kinahan

(10) Patent No.: US 7,881,887 B2
(45) Date of Patent: Feb. 1, 2011

(54) WIRELESS WIREHARNESS TESTING SYSTEM

(75) Inventor: William P. Kinahan, Redding, CT (US)

(73) Assignee: Sikorsky Aircraft Corporation, Stratford, CT (US)

( * ) Notice: Subject to any disclaimer, the term of this patent is extended or adjusted under 35 U.S.C. 154(b) by 261 days.

(21) Appl. No.: 12/172,985

(22) Filed: Jul. 14, 2008

(65) Prior Publication Data

US 2010/0010758 A1 Jan. 14, 2010

(51) Int. Cl.
*G01R 31/00* (2006.01)

(52) U.S. Cl. .................. 702/58; 702/108; 702/122; 702/123; 324/508; 324/538; 324/539; 324/600; 174/113 R

(58) Field of Classification Search ............ 702/33, 702/35, 58, 108, 121, 122, 123; 324/66, 324/503, 508, 538, 539, 600; 174/113, 113 R
See application file for complete search history.

(56) References Cited

U.S. PATENT DOCUMENTS

| | | | | |
|---|---|---|---|---|
| 4,690,475 A | * | 9/1987 | McElroy | ............ 439/502 |
| 5,127,062 A | | 6/1992 | Cerda | |
| 5,153,839 A | | 10/1992 | Cross | |
| 5,231,357 A | * | 7/1993 | Moody et al. | ............ 324/539 |
| 5,250,908 A | * | 10/1993 | Liu et al. | ............ 324/542 |
| 5,311,440 A | | 5/1994 | Hess, Jr. | |
| 5,491,631 A | * | 2/1996 | Shirane et al. | ............ 701/35 |
| 5,721,680 A | | 2/1998 | Van Cleve et al. | |
| 5,854,555 A | | 12/1998 | Sasaki | |
| 6,005,694 A | | 12/1999 | Liu | |
| 6,035,517 A | | 3/2000 | Moore et al. | |
| 6,114,856 A | | 9/2000 | Bitts | |
| 6,225,811 B1 | | 5/2001 | Bruning et al. | |
| 6,272,387 B1 | | 8/2001 | Yoon | |
| 6,281,685 B1 | | 8/2001 | Tuttle | |
| 6,323,657 B1 | | 11/2001 | Chang | |
| 6,434,512 B1 | | 8/2002 | Discenzo | |
| 6,442,498 B1 | * | 8/2002 | Krigel | ............ 702/108 |
| 6,448,778 B1 | * | 9/2002 | Rankin | ............ 324/503 |
| 6,498,995 B2 | | 12/2002 | Kawase et al. | |
| 6,625,550 B1 | | 9/2003 | Scott et al. | |
| 6,687,639 B2 | * | 2/2004 | Mori et al. | ............ 702/117 |
| 6,791,336 B2 | | 9/2004 | Krigel | |
| 6,833,713 B2 | | 12/2004 | Schoepf et al. | |
| 6,909,977 B2 | | 6/2005 | Orton | |
| 6,960,102 B2 | * | 11/2005 | Styles | ............ 439/604 |
| 7,225,065 B1 | * | 5/2007 | Hunt et al. | ............ 701/29 |
| 2004/0167689 A1 | * | 8/2004 | Bromley et al. | ............ 701/29 |
| 2005/0210969 A1 | * | 9/2005 | Albertson | ............ 73/117.2 |
| 2006/0043976 A1 | * | 3/2006 | Gervais | ............ 324/508 |
| 2006/0118323 A1 | * | 6/2006 | Kalisz et al. | ............ 174/113 R |
| 2006/0217855 A1 | * | 9/2006 | Chinnadurai et al. | ............ 701/29 |
| 2007/0184686 A1 | * | 8/2007 | Hayashi et al. | ............ 439/76.2 |
| 2007/0233445 A1 | * | 10/2007 | Moskovich et al. | ............ 703/14 |
| 2010/0109694 A1 | * | 5/2010 | Dananay et al. | ............ 324/757 |

* cited by examiner

*Primary Examiner*—Carol S Tsai
(74) *Attorney, Agent, or Firm*—Carlson, Gaskey & Olds, PC

(57) ABSTRACT

A system and method for wireharness testing includes at least one probe attachable to a connector of a wireharness, the at least one probe in wireless communication with a controller to identify a potential lack of continuity in the wireharness therebetween.

16 Claims, 3 Drawing Sheets

WIRELESS WIREHARNESS TESTING SYSTEM

BACKGROUND

The present invention relates to a wireharness testing system.

A wireharness typically includes a bundle of individual wires of varying gauges, impedances, and types, arranged in a particular order. A single wireharness may include numerous connectors to interconnect various components and systems. A multiple of wireharnesses may also be bound with other wiring harnesses in a bundle to facilitate installation, repair and maintenance.

During manufacture, faults or breaks in the wireharness may occur. Although effective conventional testing systems are available, these conventional systems may be time consuming and laborious to operate. Furthermore, these conventional systems are not conductive to operation in a manufacturing environment.

SUMMARY

A system for wireharness testing according to an exemplary aspect of the present invention includes at least one probe attachable to a connector of a wireharness, the at least one probe in wireless communication with a controller.

A method of wireharness testing according to an exemplary aspect of the present invention includes: attaching a first probe to a first connector of a wireharness; attaching a second probe to a second connector of the wireharness; and wirelessly communicating with the first probe and the second probe to identify a potential lack of continuity in the wireharness therebetween.

BRIEF DESCRIPTION OF THE DRAWINGS

The various features and advantages of this invention will become apparent to those skilled in the art from the following detailed description of the disclosed non-limiting embodiment. The drawings that accompany the detailed description can be briefly described as follows.

DETAILED DESCRIPTION OF THE DISCLOSED EMBODIMENT

Figure 1:
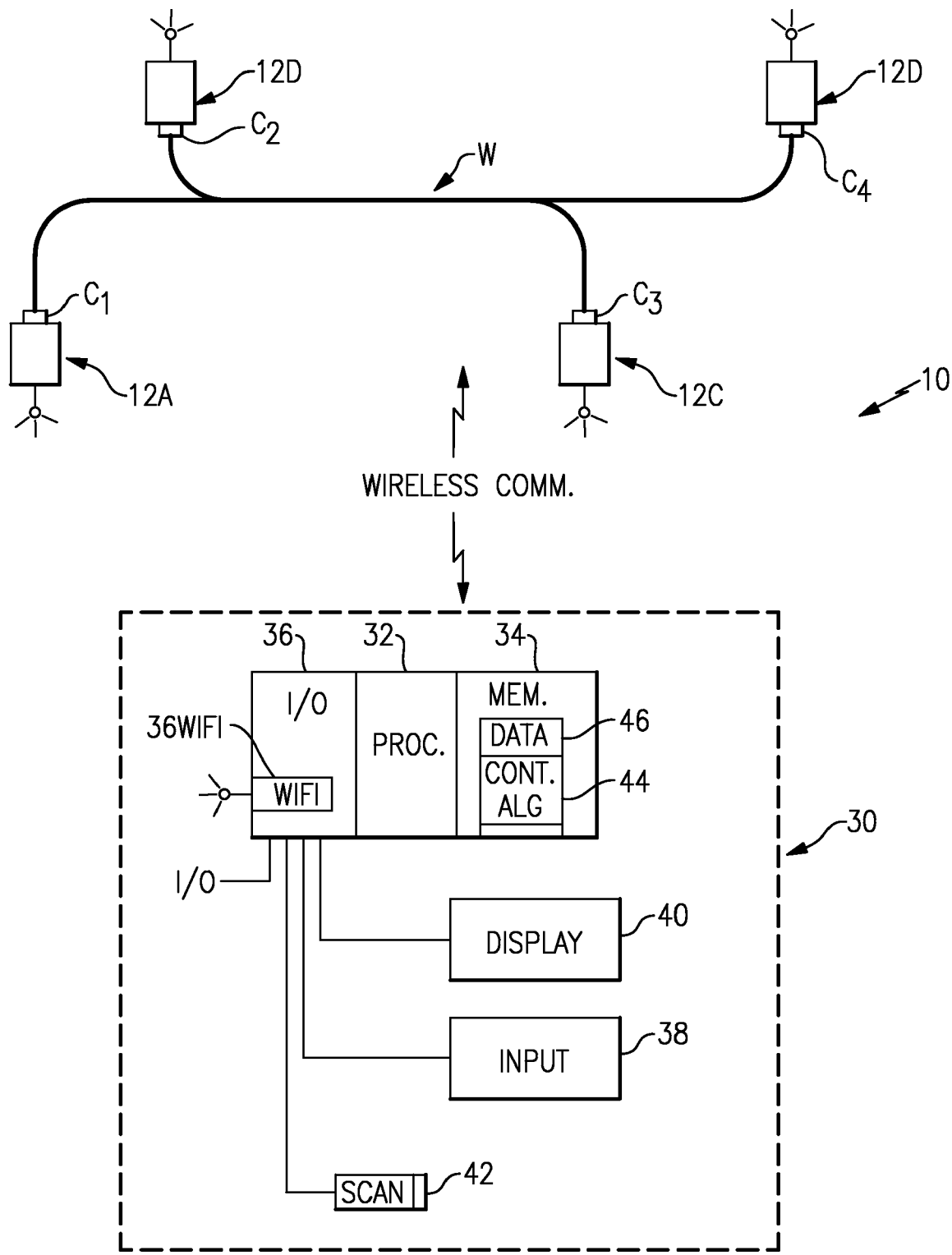
FIG. 1 is a general schematic view of one exemplary embodiment of a wireharness continuity testing system.

FIG. 1 schematically illustrates a wireharness continuity system 10 for continuity testing of a wireharness W having a multitude of connectors C (four illustrated $C_1$, $C_2$, $C_3$, $C_4$ in the disclosed non-limiting embodiment). It should be understood that the wiring harness W is exemplary only and that any wiring harness W having any number of connectors C may also benefit from the present invention. Furthermore, the wireharness W may include electrical wire, fiber optics and combinations thereof.

The wireharness continuity system 10 includes a multiple of probes 12 (four probes 12A-12D illustrated in the disclosed non-limiting embodiment—one for each connector $C_1$, $C_2$, $C_3$, $C_4$) which communicates with a controller 30 through a wireless communication network. The controller 30 may take various forms such as a central computer, multi-user computer connected to a network, a personal desktop computer, a portable computer or other such system.

The controller 30 may include a processor 32 in communication with a memory device 34 and an input/output module 36. The input/output module 36 includes a wireless network input/output module 36WIFI. The controller 30 also includes an input system 38 and a display system 40 that communicate with the processor 32 through the input/output module 36. The memory device 34 may be of any suitable storage type, such as a magnetic or optical storage medium, or volatile storage, such as a ROM or RAM device to store software, data and control algorithms such as a continuity algorithm 44 (illustrated in block form FIG. 3). The stored data and control algorithms are the scheme by which decisions are made by the wireharness continuity system 10.

The input system 38 may be any system able to input data such as a standard computer keyboard, a mouse, keypad, remote device or other operator interface. Alternatively, or in addition, the input system 38 may be a scanner 42 capable of scanning a code from the wireharness W, connector C and or other components or systems which interface with the wireharness W. The display system 40 may be of any suitable type based on, for example only, a cathode-ray tubes, liquid-crystal displays, organic light-emitting diodes, or other technologies. The input system 38 and the display system 40 may alternatively or additionally be combined such as through a touch screen system, remote terminal, hand held, or portable device.

Figure 2:
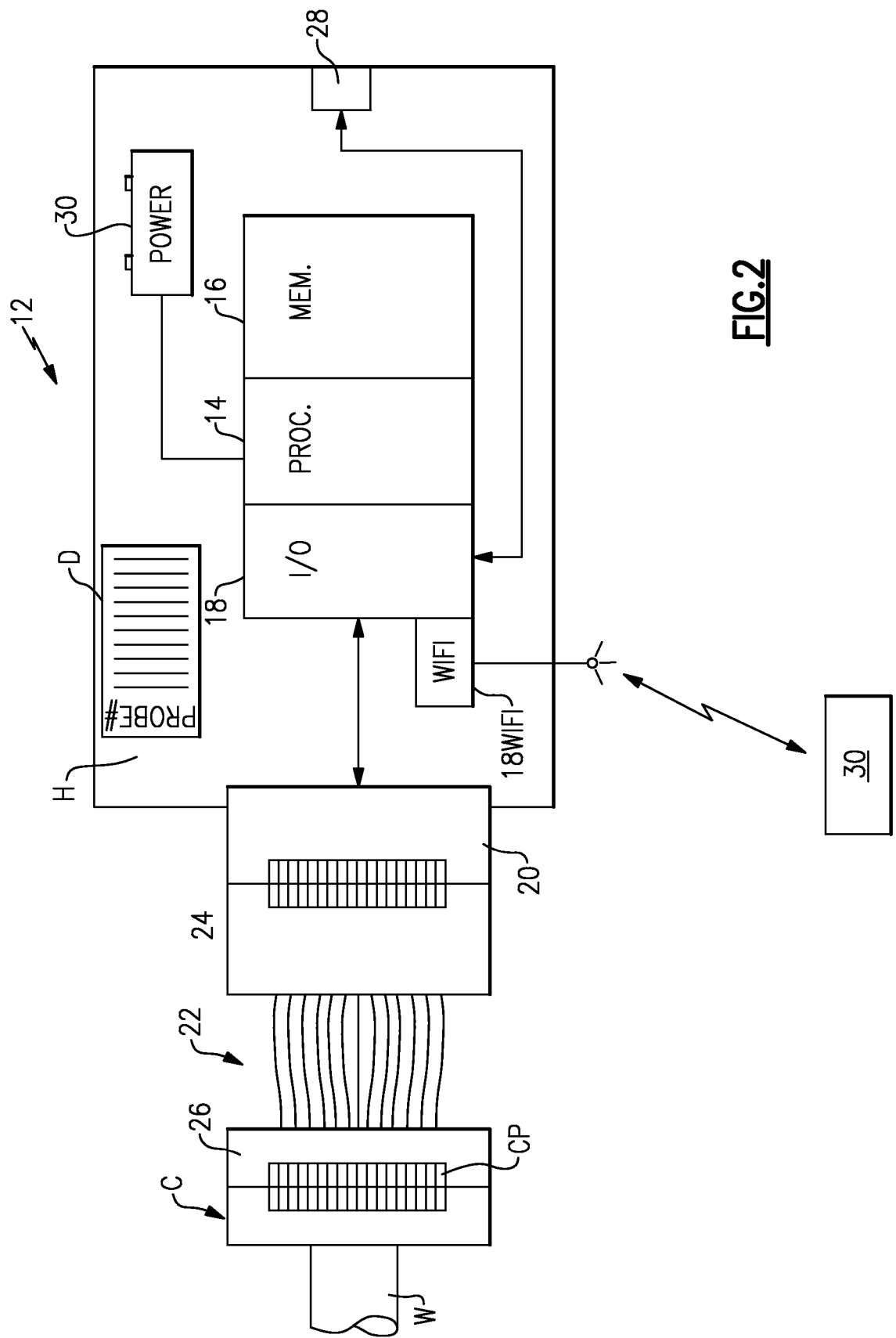
FIG. 2 is a block diagram of a probe for wireharness continuity testing.

Referring to FIG. 2, each probe 12 includes a processor 14, such as a microprocessor in communication with a memory device 16 and an input/output module 18. The input/output module 18 includes a wireless network input/output module 18WIFI for communication with the wireless network input/output module 36WIFI. The wireless communication network input/output modules 18WIFI, 36WIFI provides Ethernet capability that permits each probe 12 to transmit data and receive instruction from the controller 30 which operates on the wireless network.

Each probe 12 may include a generic connector 20 which receives an adaptor cable 22. The adaptor cable 22 includes a connector 24 which attaches to the generic connector 20 and a harness specific connector 26 which attaches to a specific wireharness connector C. It should be understood that various adaptors and connectors including dedicated harness specific connectors integrated with the probe 12 itself may alternatively or additionally be utilized so as to permit each probe 12 to attach directly to each specific wireharness connector C without the adaptor cable 22.

Each probe 12 also includes a port 28 such as a USB port and a power supply P such as a battery which readily increases portability. The port 28 allows upload and download of data with the probe 12. Also, an identifier D such as a bar code data plate may be mounted to the outside of a housing H to facilitate configuration and identification of each probe 12. The probe 12 thereby provides a completely portable solution operable within a manufacturing environment.

Figure 3:
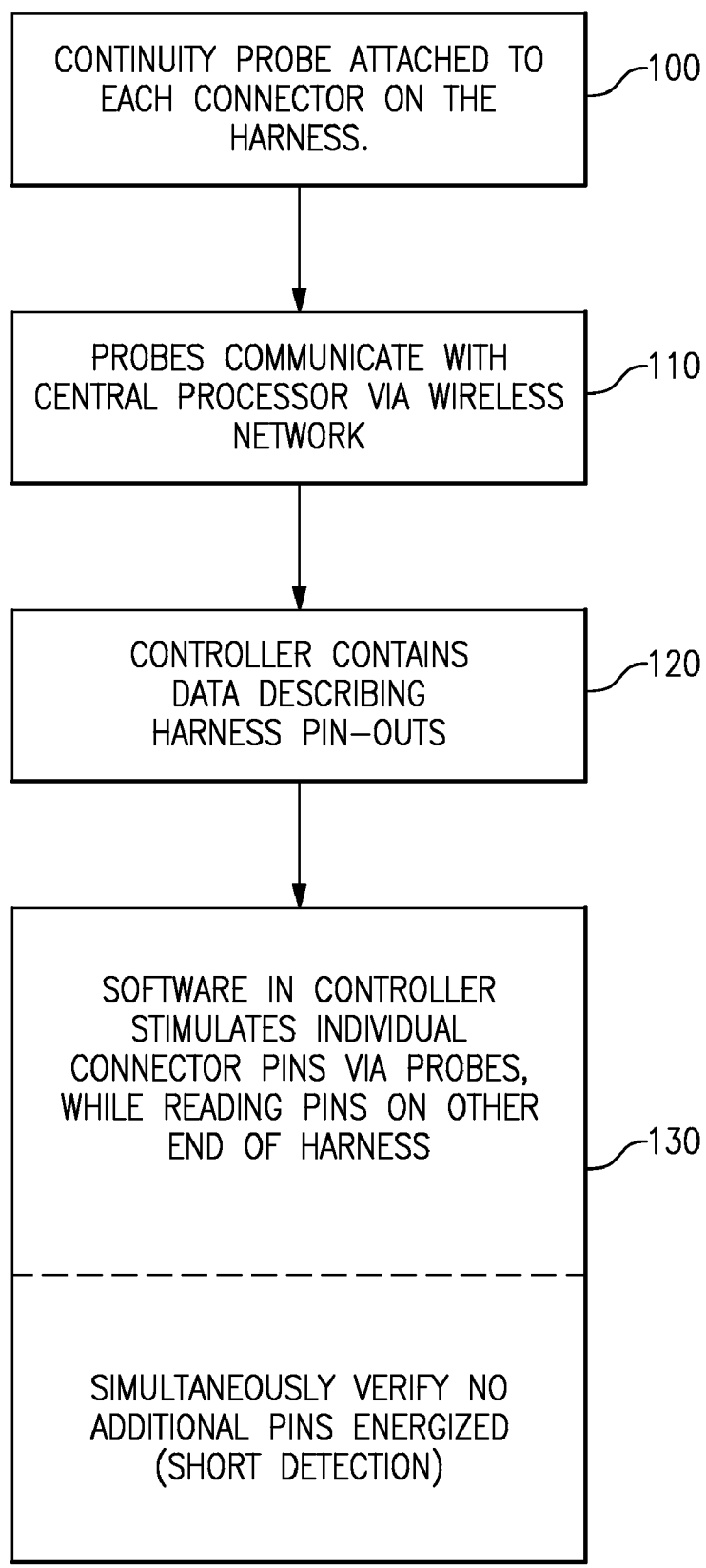
FIG. 3 is a flow chart illustrating operation of the wireharness continuity testing system in one non-limiting embodiment.

In operation and with reference to FIG. 3, a probe 12 is attached to each connector C of the wiring harness W (Step 100). It should be understood that the probes may be attached in pairs, or attached to every connector C. Each probe 12 communicates with the controller 30 via the wireless network (Step 110). It should be understood that a single probe 12 may also be utilized for a wiring harness W with a loop back or with an interface for a diagnostic technician on an opposite end.

The memory device 34 in the controller 30 contains connector data 46 with details on each connector C of a specific wireharness W such as the pins CP of each connector C as well as other associated information to simulate the systems which are connected by the specific wireharness W (FIG. 1; Step 120). The connector data 46 may alternately or additionally be stored in the memory device 16 of the probe 12.

The term "pin" as utilized herein may be considered as any type of male or female terminator on each end of each wire in the wireharness W. That is, the pin CP may be a single part of the connector C which provides communication between one wire of the wireharness W with the system or component to which the connector C will be attached when the wireharness W is installed. It should be understood that each connector C typically includes a multiple of pins and/or other terminators.

The connector data 46 may alternately or additionally be stored in the memory device 16 of the probe 12. The connector data 46 includes details of the harness W to command the probes 12 such that the continuity algorithm 44 can stimulate each individual pin CP on one connector C (for example connector C1; FIG. 1) on one end of the wireharness W via one probe 12A and reads the output on an associated pin CP of another connector C (for example connector C4; FIG. 1) via another probe 12D on another end of the harness W. The continuity algorithm 44 also verifies that no additional pins CP are energized (short detection). It should be understood that the continuity algorithm 44 may perform additional or alternative verifications.

It should be understood that relative positional terms such as "forward," "aft," "upper," "lower," "above," "below," and the like are with reference to the normal operational attitude of the vehicle and should not be considered otherwise limiting.

It should be understood that although a particular component arrangement is disclosed in the illustrated embodiment, other arrangements will benefit from the instant invention.

Although particular step sequences are shown, described, and claimed, it should be understood that steps may be performed in any order, separated or combined unless otherwise indicated and will still benefit from the present invention.

The foregoing description is exemplary rather than defined by the limitations within. Many modifications and variations of the present invention are possible in light of the above teachings. The disclosed embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. A system for wireharness testing comprising:
   a controller;
   a first probe attachable to a first connector of a wireharness, said first probe in wireless communication with said controller, said first connector including a plurality of pins;
   a second probe attachable to a second connector of the wireharness, said second probe in wireless communication with said controller, said second connector including a plurality of pins;
   a memory device storing a continuity algorithm related to the wireharness, said continuity algorithm configured to stimulate each pin of the first connector individually; wherein said continuity algorithm stimulates one pin of the first connector with the first probe, and wherein the continuity algorithm reads an output of one pin of the second connector with the second probe, the one pin of the second connector associated with the one pin of the first connector; and
   wherein said continuity algorithm verifies that the one pin of the second connector is the only pin energized in response to stimulation of the one pin of the first connector.

2. The system as recited in claim 1, wherein either of the first or second probe includes a connector attachable to the connector of the wireharness.

3. The system as recited in claim 1, wherein either of the first or second probe includes a processor.

4. The system as recited in claim 3, further comprising an input/output module in communication with said processor.

5. The system as recited in claim 1, further comprising a power supply to power either of the first or second probe.

6. The system as recited in claim 5, wherein said power supply is a battery.

7. The system as recited in claim 1, wherein either of the first or second probe includes a port to upload and download data.

8. The system as recited in claim 7, wherein said port comprises a USB port.

9. The system as recited in claim 1, wherein either of the first or second probe includes an identifier.

10. The system as recited in claim 9, wherein said identifier comprises a bar code.

11. The system as recited in claim 1, wherein said controller includes a memory device which stores a connector data related to either the first or second connector of the wireharness.

12. The system as recited in claim 1, wherein no other pins of the first connector are stimulated when the one pin of the first connector is stimulated.

13. The system as recited in claim 1, wherein the memory device is a memory device of the controller.

14. A method of wireharness testing comprising:
   attaching a first probe to a first connector of a wireharness, the first connector including a plurality of pins;
   attaching a second probe to a second connector of the wireharness, the second connector including a plurality of pins;
   wirelessly communicating with the first probe and the second probe to identify a potential lack of continuity in the wireharness therebetween;
   stimulating one pin of the first connector with the first probe;
   reading an output of one pin of the second connector with the second probe, the one pin of the second connector being associated with the one pin of the first connector; and
   verifying that the one pin of the second connector is the only pin energized in response to stimulation of the one pin of the first connector.

15. The method as recited in claim 14, wherein no other pins of the first connector are stimulated when the one pin of the first connector is stimulated.

16. The method as recited in claim 14, wherein said stimulating, reading, and verifying steps are repeated for each of the pins of the first and second connectors.

* * * * *